(12) United States Patent
Barringer et al.

(10) Patent No.: US 6,265,887 B1
(45) Date of Patent: Jul. 24, 2001

(54) MOUNTING FIXTURE FOR A PIN GRID ARRAY DEVICE

(75) Inventors: Dennis R. Barringer, Wallkill; Drew R. Horvath, Red Hook; Roger Ray Schmidt, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/400,750

(22) Filed: Sep. 22, 1999

(51) Int. Cl.[7] .................................................. G01R 31/02
(52) U.S. Cl. ..................... 324/755; 324/158.1; 324/756; 206/728; 53/390
(58) Field of Search ..................................... 324/755, 754, 324/756, 158.1; 206/701, 728; 53/390

(56) References Cited

U.S. PATENT DOCUMENTS

| | | | |
|---|---|---|---|
| 4,620,632 | * | 11/1986 | Alemanni ............................. 206/701 |
| 4,803,828 | * | 2/1989 | Tan et al. ............................... 53/390 |
| 5,080,228 | * | 1/1992 | Maston et al. ....................... 206/728 |
| 5,181,853 | | 1/1993 | Van Brunt, Jr. et al. . |
| 5,228,862 | | 7/1993 | Baumberger et al. . |
| 5,640,303 | | 6/1997 | Hooley . |
| 5,762,504 | | 6/1998 | Itoh . |
| 5,808,474 | * | 9/1998 | Hively et al. ....................... 324/755 |

* cited by examiner

*Primary Examiner*—Safet Metjahic
*Assistant Examiner*—Jimmy Nguyen
(74) *Attorney, Agent, or Firm*—Floyd Gonzalez; Cantor Colburn LLP (57) ABSTRACT

An exemplary embodiment of the invention is a fixture for mounting a pin grid array device. The fixture includes a base plate and a first support plate movably mounted to the base plate. The first support plate has a hole therein for receiving a pin on the pin grid array device. The hole has a longitudinal axis in a first direction. A contact is positioned in the hole a drive mechanism moves the first support plate in a second direction substantially perpendicular to the first direction to move the contact. The contact engages the pin of the pin grid array device to establish electrical contact.

16 Claims, 6 Drawing Sheets

MOUNTING FIXTURE FOR A PIN GRID ARRAY DEVICE

BACKGROUND OF THE INVENTION

The invention relates to an apparatus for supporting a pin grid array (PGA) device during procedures such as testing and burn-in. Electrical devices and components are often tested for performance and subjected to a burn-in process prior to release. Typically, the electrical device is mounted in a test fixture which may be used to apply signals to the device and monitor test points on the device. The test fixture may also be placed in an environmentally controlled area to perform the burn-in process during which power is applied to the device under test.

Existing fixtures for PGA devices for automatic test and burn-in use a spring probe contact to establish electrical connection with the pins of the PGA device. Typically, the device under test is driven against a bank or matrix of spring probes to make the electrical connection between the PGA device and the test circuitry. Given the large number of pins on a PGA device, the drive forces required to mate the device under test to the fixture has become excessive for conventional drive mechanisms, very expensive and cumbersome to implement. Certain applications require the generation of 500–2000 pounds of force to mate the PGA device under test to the fixture. Thus, there is a perceived need in the art for a fixture for mounting PGA devices for test and/or burn-in which does not require large forces to establish electrical connection with the PGA device.

SUMMARY OF THE INVENTION

An exemplary embodiment of the invention is a fixture for mounting a pin grid array device. The fixture includes a base plate and a first support plate movably mounted to the base plate. The first support plate has a hole therein for receiving a pin on the pin grid array device. The hole has a longitudinal axis in a first direction. A contact is positioned in the hole and a drive mechanism moves the first support plate in a second direction substantially perpendicular to the first direction to move the contact. The contact engages the pin of the pin grid array device to establish electrical contact.

DETAILED DESCRIPTION

Figure 1:
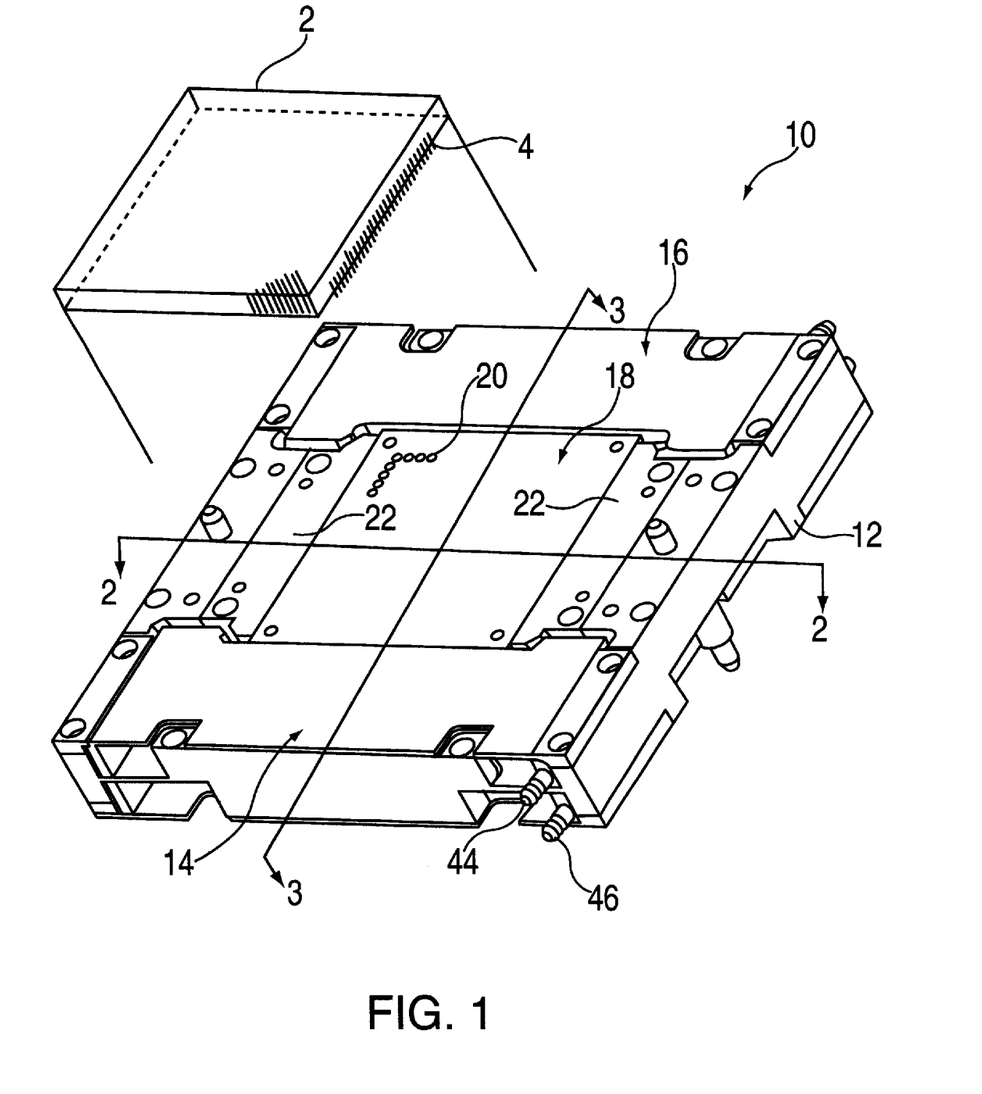
FIG. 1 is a perspective view of a mounting fixture and a PGA device.

An exemplary embodiment of the invention is a fixture for mounting a PGA device for processes such as test or burn-in purposes. It is understood that the fixture is not limited to these exemplary applications. FIG. 1 is a perspective view of a fixture, shown generally at 10, for receiving a PGA device 2. The fixture 10 includes a base plate 12 on which is mounted a first pusher assembly 14, a second pusher assembly 16 and a support assembly 18, each of which is described in detail herein. The PGA device 2 has a planar bottom and a plurality of pins 4 extending perpendicular to the bottom surface. Pins 4 are received in holes 20 in the support assembly 18. Holes 20 have a longitudinal axis along a first direction which is substantially parallel to the pin 4. To make electrical contact with pins 4, pressure is applied to the support assembly 18 by the first and second pusher assemblies 14 and 16 in a direction perpendicular to the pins 4 so that there is little or no insertion force needed to mount the PGA device to the support assembly 18.

Figure 2:
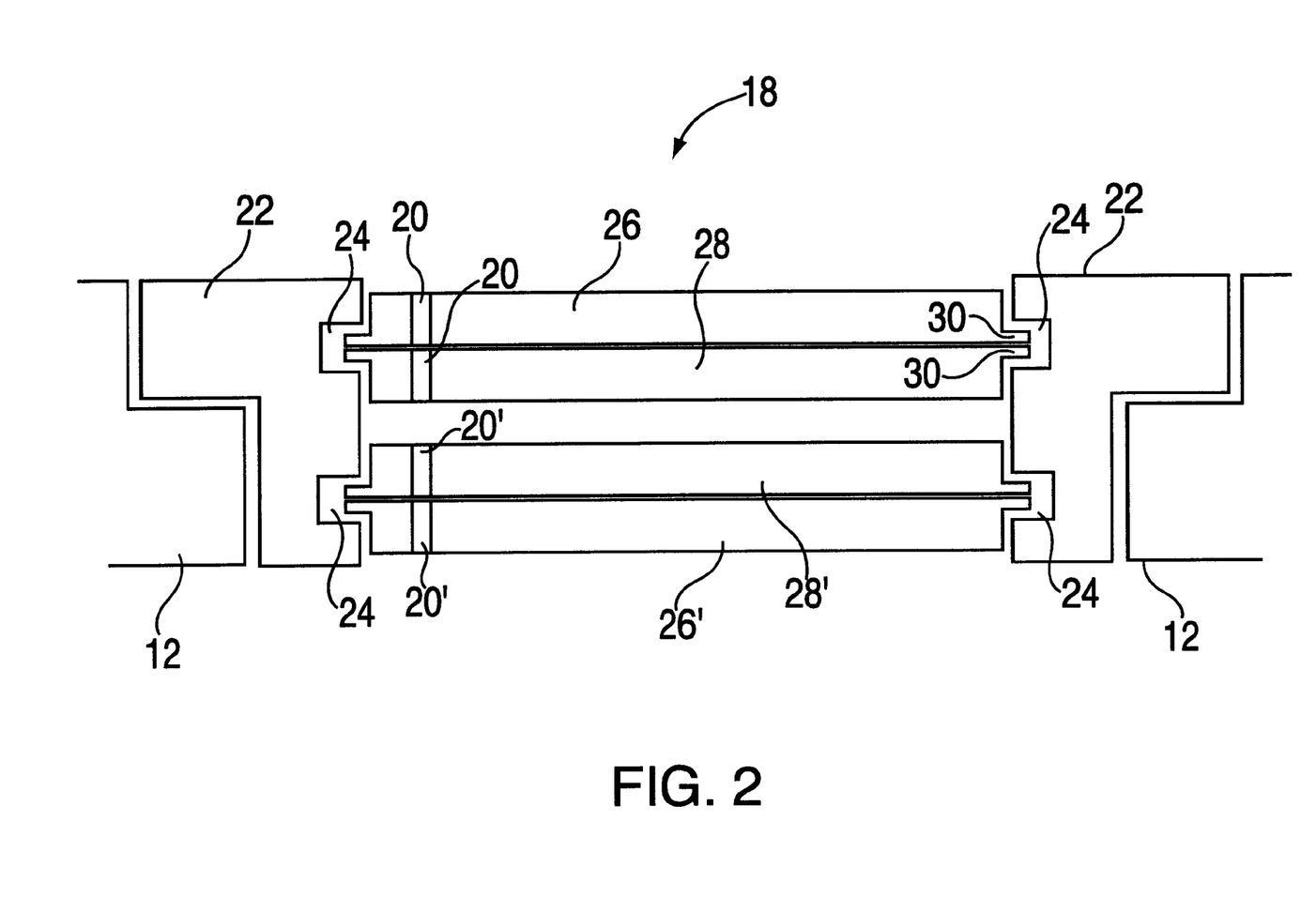
FIG. 2 is a cross sectional view taken along line 2—2 of FIG. 1.
Figure 4:
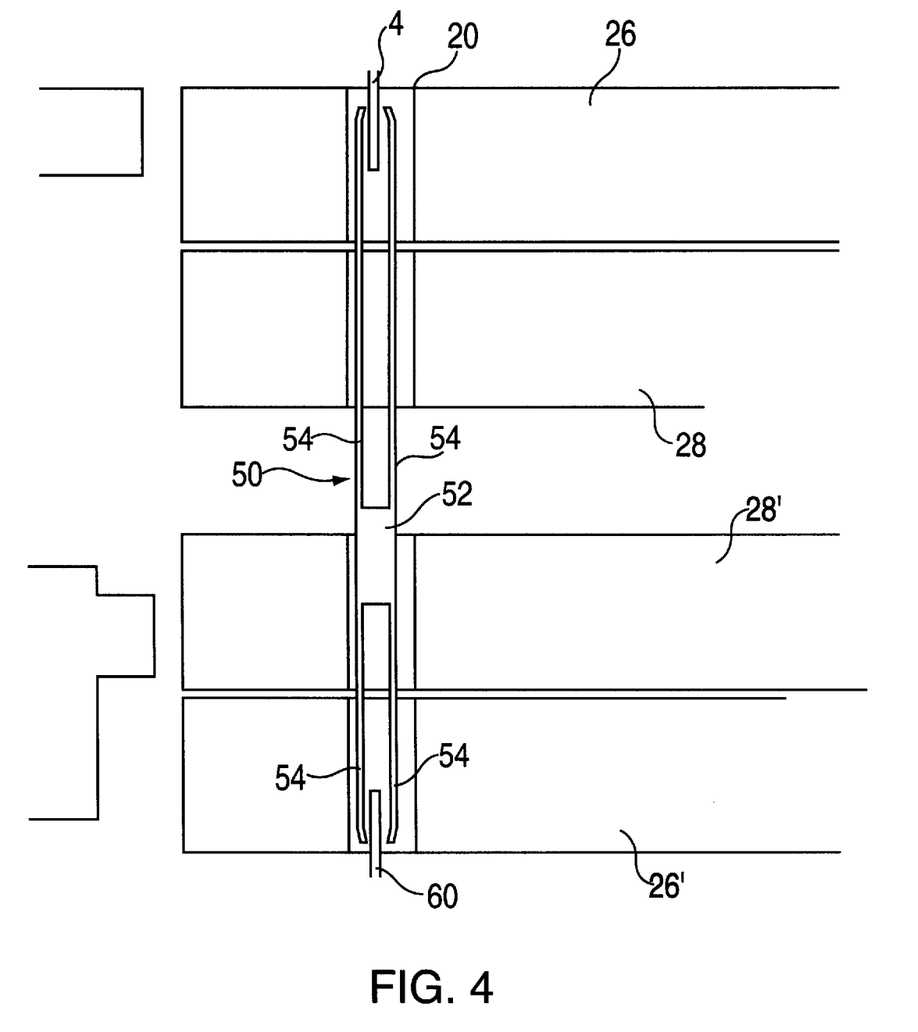
FIG. 4 is an enlarged view of a portion of FIG. 3.
Figure 5:
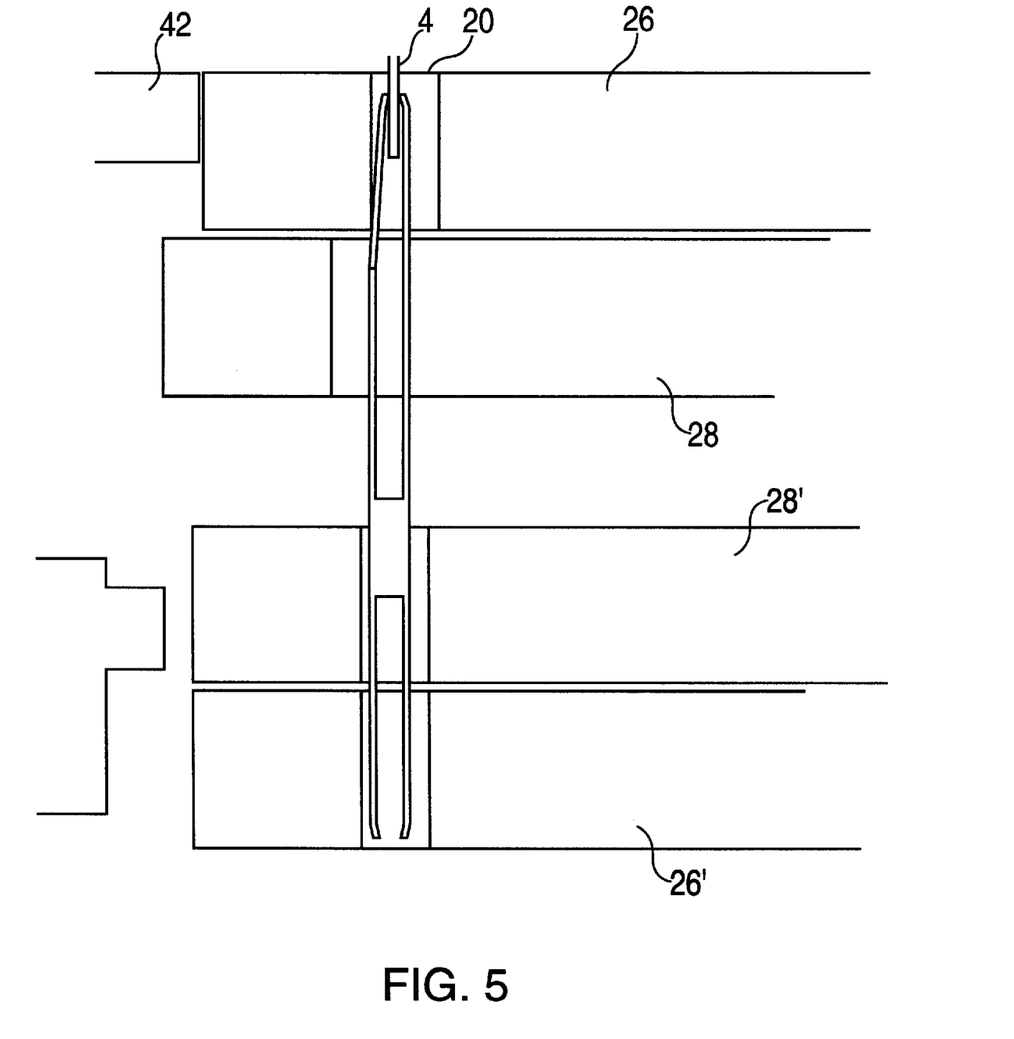
FIG. 5 is an enlarged view of a portion of FIG. 3.

FIG. 2 is a cross-sectional view of the fixture 10 taken along line 2—2 of FIG. 1 depicting the mounting of the support assembly 18 to the base plate 12. As shown in FIG. 2, the support assembly includes mounting plates 22 which are secured to base plate 12 through fasteners or other known techniques. The mounting plates 22 include grooves 24 for receiving a lip 30 of first and second support plates 26 and 28. The first and second support plates 26 and 28 have a lip 30 of reduced thickness on opposed edges. The first support plate 26 and second support plate 28 are positioned so that lips 30 on each support plate are adjacent. The first and second support plates 26 and 28 ride in grooves 24 and are free to move relative to each other. As shown in FIG. 2, there are two sets of first and second support plates, labeled 26/28 and 26'/28' respectively, in the support assembly 18. A hole 20 is formed in the first and second support plates 26 and 28. In a first state, hole 20 in first support plate 26 and hole 20 in second support plate 28 are aligned. A contact, described below with reference to FIGS. 4 and 5 is positioned in each hole 20 and extends through first and second support plates 26 and 28 and holes 20' in first and second support plates 26' and 28'.

Figure 3:
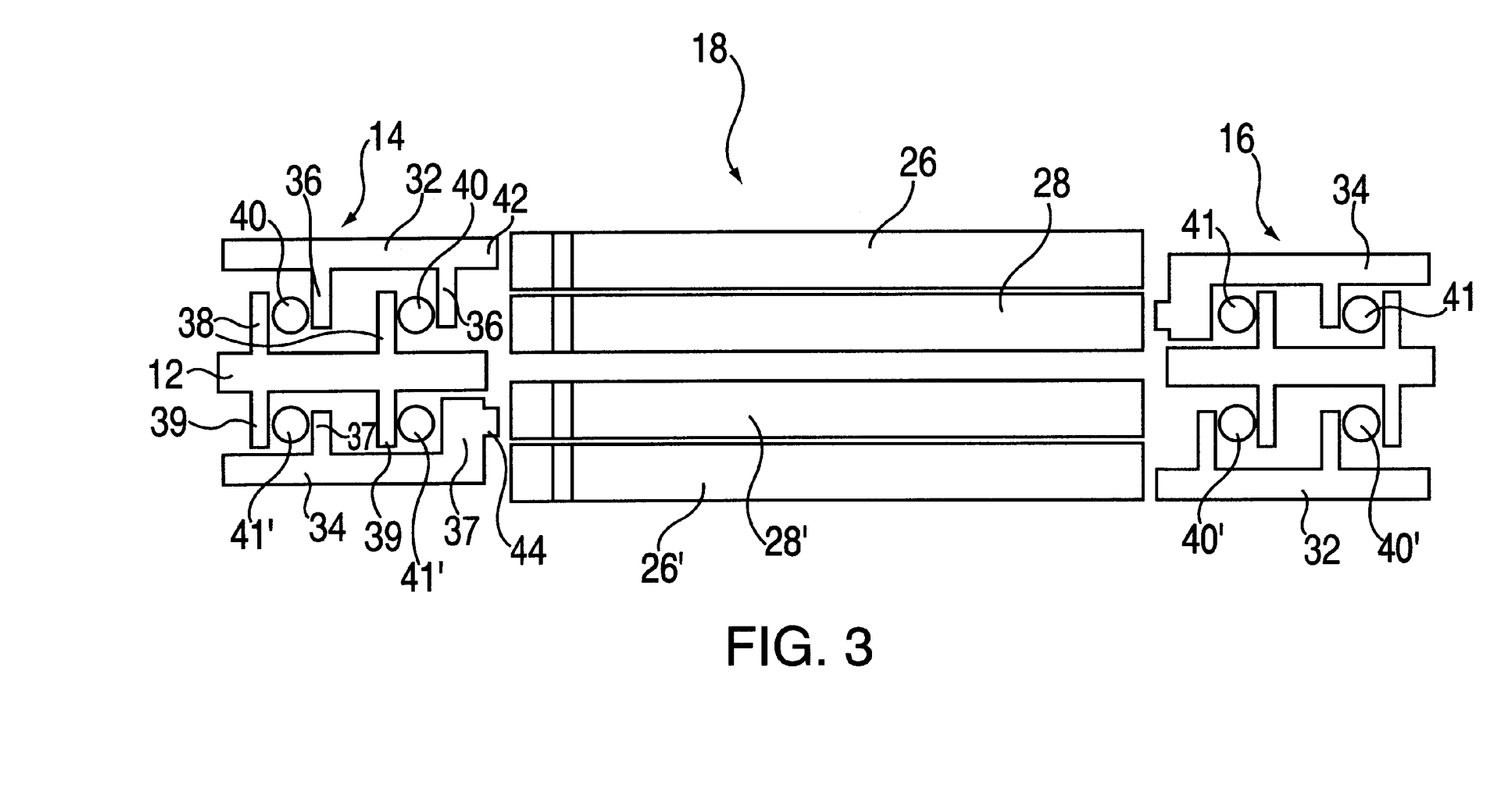
FIG. 3 is a cross sectional view taken along line 3—3 of FIG. 1.

FIG. 3 is a cross-sectional view taken along line 3—3 of FIG. 1. As shown in FIG. 3, the first pusher assembly 14 and second pusher assembly 16 are similarly fashioned except that second pusher assembly 16 is inverted with respect to first pusher assembly 14. Thus, only the first pusher assembly 14 will be described. The first pusher assembly 14 includes a first plusher plate 32 and a second pusher plate 34 disposed on opposite sides of the base plate 12. The first pusher plate 32 includes extensions 36 which extend from the bottom surface of first pusher plate 32 generally perpendicular to the first pusher plate 32. The extensions 36 are each located on one side of ridges 38 formed on base plate 12. The ridges 38 extend away from base plate 12 and are generally perpendicular to base plate 12. Positioned between each ridge 38 and extension 36 is a bladder 40 which is capable of being inflated. First pusher plate 32 includes a lip 42 for contacting first support plate 26 but not second support plate 28.

Second pusher plate 34 is similar to first pusher plate 32 in that second pusher plate includes extensions 37 which extend away from the bottom of second pusher plate 34 and are generally perpendicular to second pusher plate 34. The base plate 12 includes additional ridges 39 formed opposite ridges 38. The extensions 37 are each located on one side of ridges 39 formed on base plate 12. The ridges 39 extend away from base plate 12 and are generally perpendicular to base plate 12. Positioned between each ridge 39 and extension 37 is a bladder 41 which is capable of being inflated. Second pusher plate 34 includes a lip 44 for contacting second support plate 28' but not first support plate 26.

Bladders 40 and 41' are inflated through inlets 44 and 46 respectively. Although two inlets are shown for each pusher assembly, it is understood that each pusher assembly 14 and 16 may have one inlet. Alternatively, a single inlet may be used to inflate all bladders in the first pusher assembly 14 and the second pusher assembly 16. The first pusher assembly 14 and second pusher assembly 16 may implemented using other configurations such as a single device for applying force to the pairs of first and second support plates 26/28 and 26'/28'. Accordingly, it is understood that use of a first pusher assembly 14 and second pusher assembly 16 is an exemplary embodiment of a drive mechanism.

As can be seen from FIGS. 2 and 3, when bladder 40 in first pusher assembly 14 is inflated, the first pusher plate 32 is directed towards first support plate 26. Lip 42 contacts the edge of first support plate 26 and drives first support plate 26 in a second direction substantially perpendicular to the first direction described above. If bladder 41' in first pusher assembly 14 is inflated, the second pusher plate 34 is directed towards second support plate 28'. Lip 44 contacts the edge of second support plate 28' and drives second support plate 28' in the second direction. Second pusher assembly 16 operates in a similar fashion but drives second support plate 28 and first support plate 26' opposite the second direction.

As described above, inflation of bladders 40 and 41 creates relative motion between first support plate 26 and second support plate 28. This relative motion creates an electrical connection between a contact in hole 20 and a pin 4 on the PGA device 2. FIGS. 4 and 5 are enlarged views of a portion of FIG. 3. FIG. 4 shows a conductive contact 50 which is placed in holes 20 in first and second support plates 26 and 28 and first and second support plates 26' and 28'. In FIG.4, none of the bladders are inflated and holes 20 in first and second support plates 26 and 28 are aligned. Similarly, holes 20' in first and second support plates 26' and 28' are aligned. The contact 50 includes a cylindrical body 52 and a pair of resilient contact arms 54 which extend away from both ends of the body 52. The contact 50 is supported by interference between body 52 and support plate 28'. When a PGA device is mounted to the fixture 10, the pins 4 are placed in holes 20 so that the pin 4 is located between the contact arms 54. The distal end of contact arm 54 may be bent to direct the contact arm 54 towards the pin 4.

As shown in FIG. 5, inflation of bladders 40 and 41 (FIG. 3), causes the first support plate 26 to move relative to the second support plate 28. The motion of first support plate 26 and second support plate 28 cause the contact arms 54 to be driven towards each other to make electrical contact with pin 4. As described above, the first support plate 26 moves in a second direction substantially perpendicular to the first direction (i.e., the longitudinal axis of hole 20). The second support plate 28 is moved opposite the second direction. The contact 50 shown in FIGS. 4 and 5 is exemplary and it is understood that a variety of contact designs may be used to establish electrical connection with pins 4 on the PGA device 2. Thus, the invention is not limited to contacts having two contacts arms as shown in FIGS. 4 and 5. In an alternate embodiment of the invention, contact 50 may be replaced by plating the interior surface of holes 20 with a conductive material (e.g., copper).

As described above, the fixture 10 may be used for test or burn-in processes. During a test process, a connector having a plurality of pins is mounted to first support plate 26' in a manner similar to mating of the PGA device 2 to first support plate 26. An exemplary pin 60 from a connector is shown in FIG. 4. Power and test signals may then be transmitted between the test connector and the PGA device 2 over contacts 50. During a burn-in process, a connector having at least one pin 60 is mounted to first support plate 26' in a similar manner. Power is applied to the PGA device 2 through contacts 50. As described above with respect to hole 20, hole 20' has a longitudinal axis in a first direction generally parallel to contact 60. The second support plate 28' is moved in the second direction substantially perpendicular to the first direction. The first support plate 26' is moved opposite the second direction.

Figure 6:
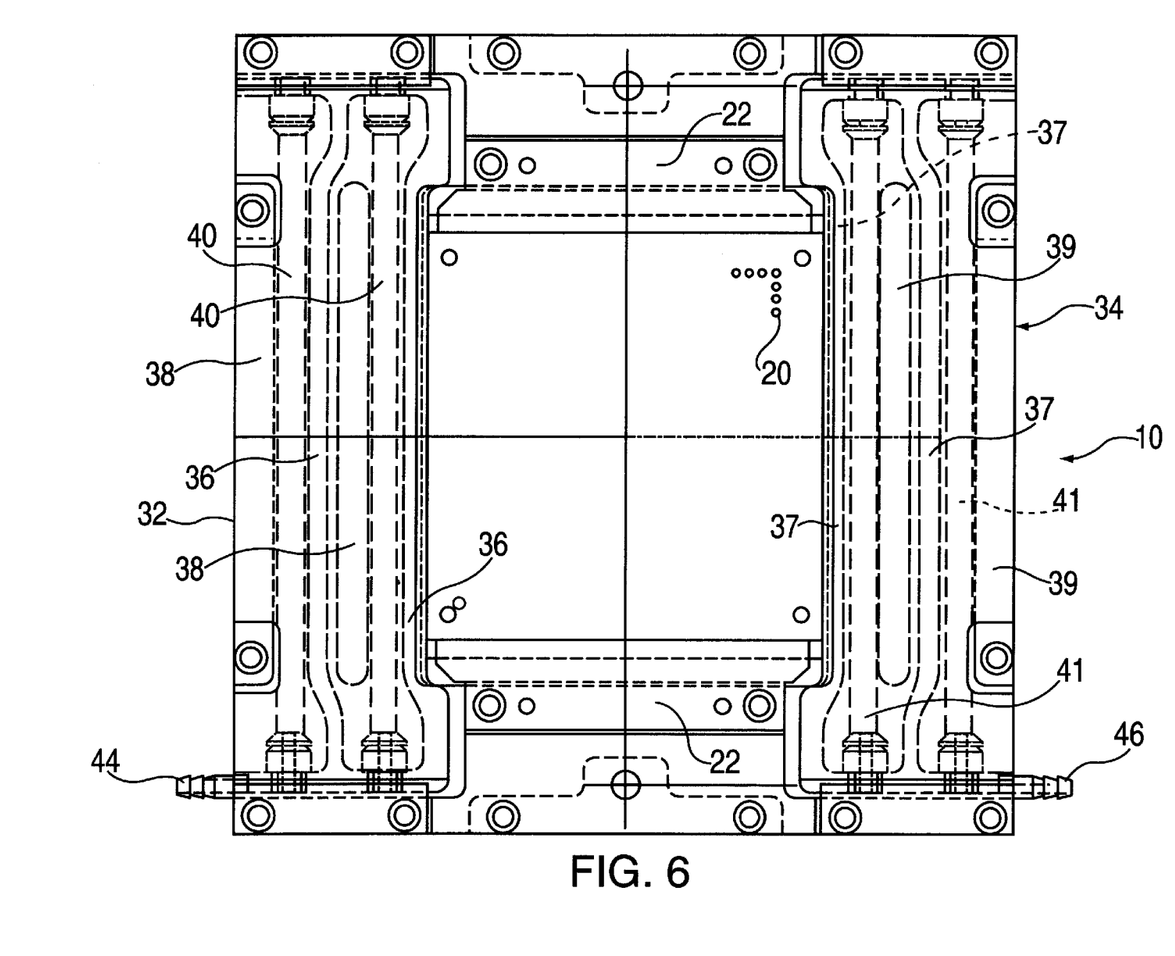
FIG. 6 is a top view of the mounting fixture.

FIG. 6 is a top view of fixture 10 showing the location of bladders 40 and 41. As described above, bladders 40 are inflated through inlet 44 and bladders 41 are inflated through inlet 46. In an exemplary embodiment, bladders 40 and 41 are inflated using air but it is understood that any fluid may be used (e.g., hydraulic).

The exemplary embodiments of the invention described herein provide for mounting a PGA device with little or no insertion force. This is achieved using forces substantially perpendicular to the pins of the PGA device. The use of inflatable bladders allows the fixture to be remotely and/or automatically actuated.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A fixture for mounting a pin grid array device, the fixture comprising:

a base plate;

a first support plate movably mounted to said base plate, said first support plate having a hole therein, said hole receiving a pin on the grid array device, said hole having a longitudinal axis in a first direction;

a contact positioned in said hole; and a drive mechanism for moving said first support plate in a second direction substantially perpendicular to said first direction to move said contact so as to make an electrical connection between said contact and a pin on said pin grid array device.

2. The fixture of claim 1 further comprising:

a second support plate adjacent said first support plate and having a hole therein aligned with said hole in said first support plate;

wherein said contact extends into said hole in said second support plate.

3. The fixture of claim 2 wherein:

wherein said drive mechanism moves said second support plate in a direction opposite said second direction.

4. The fixture of claim 3 wherein:

said contact includes a first contact arm and a second contact arm, said first support plate driving said first contact arm in said second direction, said second support plate driving said second contact arm opposite said second direction.

5. The fixture of claim 1 wherein:

said drive mechanism includes a first pusher assembly having a first pusher plate for contacting said first support plate; and an inflatable bladder for contacting said first pusher plate and moving said first pusher plate in said second direction.

6. The fixture of claim 5 wherein:

said first pusher plate includes an extension extending substantially perpendicular to said first pusher plate;

said base plate includes a ridge extending substantially perpendicular to said base plate; and said bladder is positioned between said extension and said ridge.

7. The fixture of claim 3 wherein:

said drive mechanism includes a second pusher assembly having a second pusher plate for contacting said second support plate; and an inflatable bladder for contacting said second pusher plate and moving said second pusher plate opposite said second direction.

8. The fixture of claim 7 wherein:

said second pusher plate includes an extension extending substantially perpendicular to said second pusher plate;

said base plate includes a ridge extending substantially perpendicular to said base plate; and said bladder is positioned between said extension and said ridge.

9. A fixture for mounting a pin grid array device, the fixture comprising:

a base plate;

a first support plate movably mounted to said base plate, said first support plate having a hole therein, said hole receiving a pin on the pin grid array device, said hole having a longitudinal axis in a first direction;

a further first support plate movably mounted to said base plate, said further first support plate having a further hole therein, said further hole receiving a pin on a connector, said further hole having a longitudinal axis in the first direction;

a contact positioned in said hole in said first support plate and in said further hole in said further first support plate; and a drive mechanism for moving said first support plate in a second direction substantially perpendicular to said first direction and for moving said further first support plate opposite said second direction.

10. The fixture of claim 9 further comprising:

a second support plate adjacent said first support plate and having a hole therein aligned with said hole in said first support plate;

wherein said contact extends into said hole in said second support plate.

11. The fixture of claim 10 wherein:

wherein said drive mechanism moves said second support plate in a direction opposite said second direction.

12. The fixture of claim 11 wherein:

said contact includes a first contact arm and a second contact arm, said first support plate driving said first contact arm in said second direction, said second support plate driving said second contact arm opposite said second direction.

13. The fixture of claim 9 wherein:

said drive mechanism includes a first pusher assembly having a first pusher plate for contacting said first support plate; and an inflatable bladder for contacting said first pusher plate and moving said first pusher plate in said second direction.

14. The fixture of claim 13 wherein:

said first pusher plate includes an extension extending substantially perpendicular to said first pusher plate;

said base plate includes a ridge extending substantially perpendicular to said base plate; and said bladder is positioned between said extension and said ridge.

15. The fixture of claim 11 wherein:

said drive mechanism includes a second pusher assembly having a second pusher plate for contacting said second support plate; and an inflatable bladder for contacting said second pusher plate and moving said second pusher plate opposite said second direction.

16. The fixture of claim 15 wherein:

said second pusher plate includes an extension extending substantially perpendicular to said second pusher plate;

said base plate includes a ridge extending substantially perpendicular to said base plate; and said bladder is positioned between said extension and said ridge.

* * * * *

UNITED STATES PATENT AND TRADEMARK OFFICE
CERTIFICATE OF CORRECTION

PATENT NO.    : 6,265,887 B1
DATED         : July 24, 2001
INVENTOR(S)   : Barringer et al.

It is certified that error appears in the above-identified patent and that said Letters Patent is hereby corrected as shown below:

<u>Title page,</u>
Item [57], ABSTRACT,
Line 7, before "drive" delete "hole a" and insert therefor -- hole. A --

<u>Column 4,</u>
Line 45, before, "said drive" delete -- wherein --

Signed and Sealed this

Fifth Day of April, 2005

JON W. DUDAS
*Director of the United States Patent and Trademark Office*